(12) United States Patent
Konno

(10) Patent No.: US 7,332,802 B2
(45) Date of Patent: Feb. 19, 2008

(54) PACKAGE FOR SEMICONDUCTOR LIGHT EMITTING ELEMENT AND SEMICONDUCTOR LIGHT EMITTING DEVICE

(75) Inventor: Kuniaki Konno, Kanagawa-ken (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 11/158,326

(22) Filed: Jun. 22, 2005

(65) Prior Publication Data
US 2005/0280019 A1 Dec. 22, 2005

(30) Foreign Application Priority Data
Jun. 22, 2004 (JP) ............................. 2004-183156

(51) Int. Cl.
*H01L 23/48* (2006.01)
(52) U.S. Cl. .................. 257/690; 257/685; 257/686; 257/704; 257/708; 257/710; 257/924
(58) Field of Classification Search ..................... None
See application file for complete search history.

(56) References Cited

U.S. PATENT DOCUMENTS

| 5,821,532 A | * | 10/1998 | Beaman et al. ............. 250/239 |
| 6,480,389 B1 | | 11/2002 | Shie et al. |
| 6,911,731 B2 | * | 6/2005 | Wu ............................ 257/727 |
| 2002/0070450 A1 | * | 6/2002 | McKnight .................... 257/737 |

FOREIGN PATENT DOCUMENTS

CN 2692845 Y 4/2005

OTHER PUBLICATIONS

CN Office Action dtd Mar. 30, 2007, CN Appln. 2005100790006.

* cited by examiner

*Primary Examiner*—Wai-Sing Louie
(74) *Attorney, Agent, or Firm*—Banner & Witcoff, Ltd

(57) ABSTRACT

A package for semiconductor light emitting element is described. The package includes a first metal substrate having a cup shaped recess portion, an insulating member having a first cup shaped opening, provided on the first metal substrate, and a second metal substrate having a second cup shaped opening, provided on the insulating member with being electrically insulated from the first metal substrate, having a cavity in the inner surface.

20 Claims, 8 Drawing Sheets

PACKAGE FOR SEMICONDUCTOR LIGHT EMITTING ELEMENT AND SEMICONDUCTOR LIGHT EMITTING DEVICE

CROSS REFERENCE TO RELATED APPLICATION

This application is based upon and claims the benefit of priority from the prior Japanese Patent Application No. 2004-183156, filed on Jun. 22, 2004; the entire contents of which are incorporated herein by reference.

BACKGROUND OF THE INVENTION

A semiconductor light emitting element, especially light emitting diode (LED), is used for various purposes such as full color displays, traffic signals, and lights for vehicles. These applications require high light output.

High luminous flux LEDs, which are driven by large current over several hundred mA, are watched with keen interest. The LEDs generate large amounts of heat because they are driven by large currents. Semiconductor light emitting devices alone do not radiate heat well.

A conventional package for semiconductor light emitting device which has a structure of heat radiation is shown in FIG. 1 and its associated description in the Japanese patent laid open No. 2004-22802, corresponding to U.S. Pat. No. 6,480,389.

The package for semiconductor light emitting device shown in the Japanese Laid Open patent publication has a cup shaped metal substrate. An oxidized metal is provided on the top surface. A metal solder deposited layer is provided on the bottom surface. One electrode is formed on the inner surface of the cup shaped metal substrate; the other electrode is formed on the outside surface of the metal substrate.

One end of electrode of the light emitting element is mounted on the inner surface of the metal surface. The other end of the light emitting element is wire-bonded to outer surface of the cup-shaped portion.

The cup-shaped portion is filled with an electrically insulating coolant. The electrical insulated coolant is enclosed by lens.

But in the conventional package shown in Japanese patent laid open No. 2004-22802, the bonding ball and the bonding wire protrude outward from the top surface of the cup-shaped metal substrate. This is because the bonding pad for the wire from the light emitting element is provided on the top surface of the metal substrate.

In the case a plurality of light emitting devices is arrayed and connected each other, it is hard to connect their electrodes when provided on the top surface. So, another pad for connecting them is needed.

The electrode layer, which is formed on the top surface of the metal substrate via an oxidized metal, has a high electrical resistance. This high resistance causes the conventional semiconductor light emitting device to heat up when driven by a high current (such as hundreds of mA).

SUMMARY OF THE INVENTION

Aspects of the present invention address one or more issues described above, thereby providing an improved LED.

DETAILED DESCRIPTION

The following provides a brief overview of some aspects of the present invention.

One aspect of the present invention may have a package for semiconductor light emitting element, comprising: a first metal substrate having a cup shaped recess portion; an insulating member having a first cup shaped opening, provided on the first metal substrate; and a second metal substrate having a second cup shaped opening, provided on the insulating member with being electrically insulated from the first metal substrate, having a cavity in the inner surface.

Another aspect of the present invention may have a semiconductor light emitting device, comprising: a first metal substrate having a cup shaped recess portion; an insulating member having a first cup shaped opening, provided on the first metal substrate; a second metal substrate having a second cup shaped recess portion, provided on the insulating member with being electrically insulated from the first metal substrate, having a cavity in the inner surface; a light emitting element mounted on the first metal substrate, a first electrode of the light emitting element being electrically connected to the first metal substrate; a wiring connecting the light emitting element and the second metal substrate, one end of the wiring being connecting to a second electrode of the light emitting element, another end of the wiring being connecting to the second metal substrate.

It is noted that various connections are set forth between elements in the following description. It is noted that these connections in general and, unless specified otherwise, may be direct or indirect and that this specification is not intended to be limiting in this respect.

Embodiments of the present invention will be explained in reference to the drawings as follows.

THE FIRST EMBODIMENT

Figure 1A:
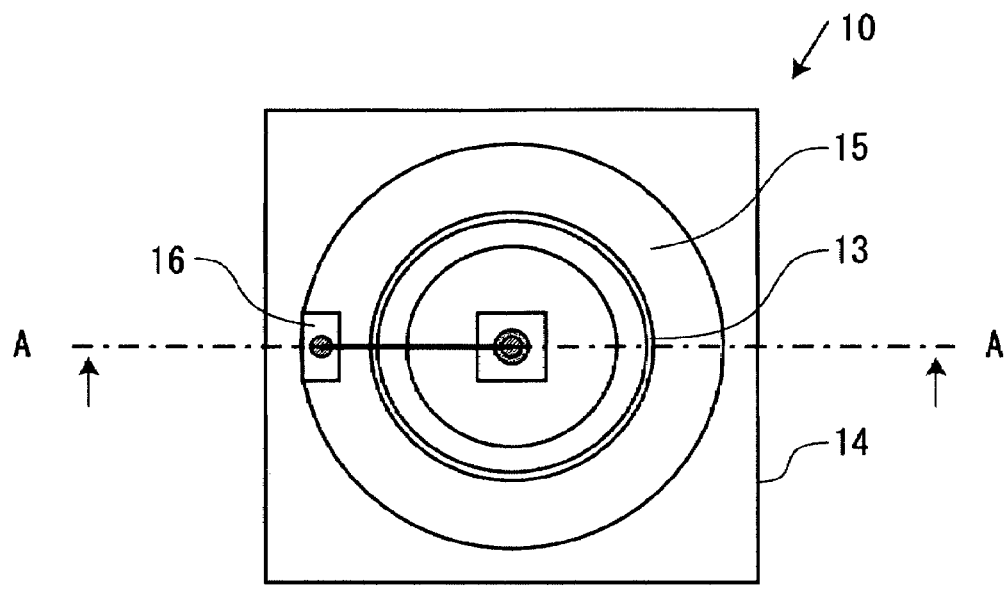
FIG. 1A is a plane view of a package for a semiconductor light emitting element according to a first embodiment of the present invention.
Figure 1B:
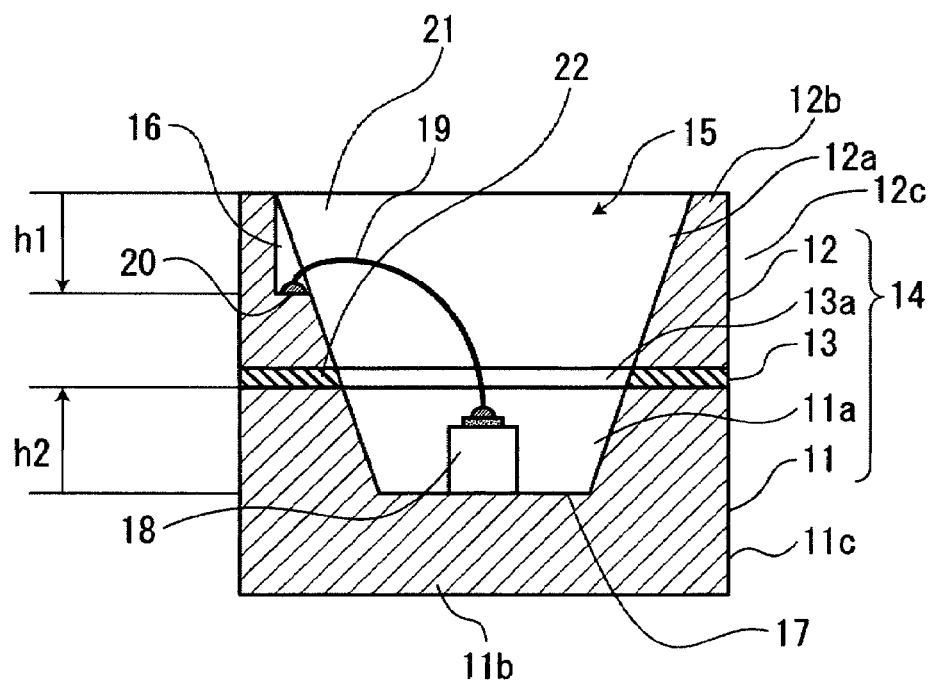
FIG. 1B is a cross sectional view taken along A-A line in FIG. 1A of a package for semiconductor light emitting element according to a first embodiment of the present invention.

A first embodiment of the present invention will be explained with reference to FIG. 1A to FIG. 5. FIG. 1A is a plane view of a package for semiconductor light emitting element according to a first embodiment of the present invention. FIG. 1B is a cross sectional view taken along A-A line and seen to the arrow in FIG. 1A of a package for semiconductor light emitting element according to a first embodiment of the present invention.

As shown in FIG. 1A and FIG. 1B, a package for semiconductor light emitting element 10 according to this embodiment has a substrate 14, cup shaped portion 15, which is formed in substrate 14, and a cavity 20, which is formed in an inner surface 22 of substrate 14.

Cup shaped portion 15, which has a larger opening than bottom area. Inner surface 22 is slanted.

Substrate 14 is formed by stacking a first metal substrate 11, an insulating member 13 and a second metal substrate 12 in this order. First metal substrate 11 and second metal substrate 12 are joined via insulating member 13. They are insulated from each other. Insulating member 13 has a junction material on an upper surface (the upward surface in FIG. 1B), which is facing first metal substrate 11 and a bottom surface (downward surface in FIG. 1B), which is facing second metal substrate 12.

For example, a material of first metal substrate portions 11 and 12 may include copper (Cu), which may be plated by nickel (Ni) and silver (Ag). For example, a material of insulating member 13 is alumina (Al2O3) and upper and bottom surfaces are coated by hard solder.

In this embodiment, first metal substrate portion 11 and second metal substrate portion 12 are joined by the hard solder, which is coated on the upper and bottom surfaces of insulating member 13.

First metal substrate 11 has a cup shaped recess portion 11a, which opens to upper surface thereof with a larger area than its bottom area. Insulating member 13 has a cup shaped opening 13a, which opens to upper surface thereof with a large area than its bottom area and opening 13a extends through insulating member 13. Second metal substrate 12 has a cup shaped opening 12a, which opens to upper surface thereof with a large area than its bottom area and opening 12a extends through second metal substrate 12.

First metal substrate 11, insulating member 13 and second metal substrate 12 are formed so that an inner surface of cup shaped recess portion 11a, cup shaped opening 13a, and cup shaped opening 12a are formed flat surface. The flat surface creates inner surface 22.

A light emitting element 18 is mounted on a bottom surface 17 of substrate 14. A first electrode (anode) of light emitting element 18 is connected to first substrate 11 by an electric conductive adhesive or eutectic junction. Thus first electrode (anode) of light emitting element 18 is electrically connected to first substrate 11 of substrate 14.

One end of a wiring 19 is connected to a second electrode (cathode) of light emitting element 18; the other end of wiring 19 is connected to the bottom 20 of cavity 16. Thus second electrode (cathode) of light emitting element 18 is electrically connected to second substrate 12 of substrate 14.

Inner surface 22 functions as reflecting mirror which reflects light emitted from light emitting element 18.

A transparent resin 21 is enclosed in the cup shaped portion 15 of substrate 14. It may be enclosed a fluorescent with transparent resin 21 in order to output one or more predetermined wavelengths of light out of the semiconductor light emitting device.

The structure and position of cavity 16 will be explained herein after. Cavity 16 is provided such that wiring 19 extended from second electrode of light emitting element 18 is bonded to second metal substrate portion 12.

The bottom 20 of cavity 16 is flat. Concavity 16 is provided to wiring 19, which is not protruding outward from the uppermost part of cup shaped portion 15. Bottom 20 is apart from the uppermost part of cup shaped portion 15. Insulating member 13 may be provided below or over the top of light emitting element 18.

First metal substrate 11 functions as a wiring from the first electrode of light emitting element 18 to outside via an electrical connection means, such as a lead frame (not shown in FIG. 1A and FIG. 1B). The electrical connection means may be connected from a back surface 11b or an outside surface 11c of first metal substrate 11.

Second metal substrate 12 functions as a wiring from the second electrode of light emitting element 18 to outside via an electrical connection means such as a lead frame (not shown in FIG. 1A and FIG. 1B). The electrical connection means may be connected from a top surface 12b or an outside surface 12c of first metal substrate 11.

The heat radiation of package for light emitting element 18 is improved.

A method of fabricating package for semiconductor light emitting element will be explained hereinafter with reference to FIG. 2 and FIG. 3. FIG. 2 and FIG. 3 are cross sectional views of a package for semiconductor light emitting element fabricated according to a first embodiment of a method in accordance with the present invention.

Figure 2A:
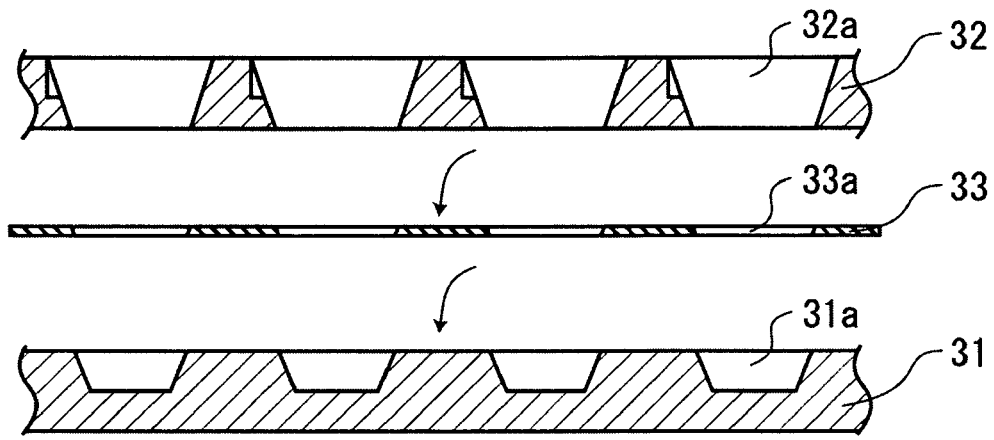
FIG. 2 is a cross sectional view of a package for a semiconductor light emitting element fabricated according to a first embodiment of a method in accordance with the present invention.

As shown in FIG. 2A, a first substrate 31, an insulating member 33 and a second substrate 32 are stacked in this order. Upper and bottom surfaces are coated by hard solder.

First substrate 31 has a plurality of a cup shaped recess portion 31a. Cup shaped recess portion 31a opens to upper surface thereof with a large area than its bottom area.

Insulating member 33 has a plurality of a cup shaped opening 33a. Cup shaped opening 33a opens to upper surface thereof with a large area than its bottom area and extends through insulating member 33.

Second substrate 32 has a plurality of a cup shaped opening 32a. Cup shaped opening 32a opens to upper surface thereof with a large area than its bottom area and extends through second substrate 32.

First substrate 31, insulating member 33 and second metal 32 are formed so that an inner surface of cup shaped recess portion 31a, cup shaped opening 33a, and cup shaped opening 32a are formed to create a flat inner surface.

Figure 2B:
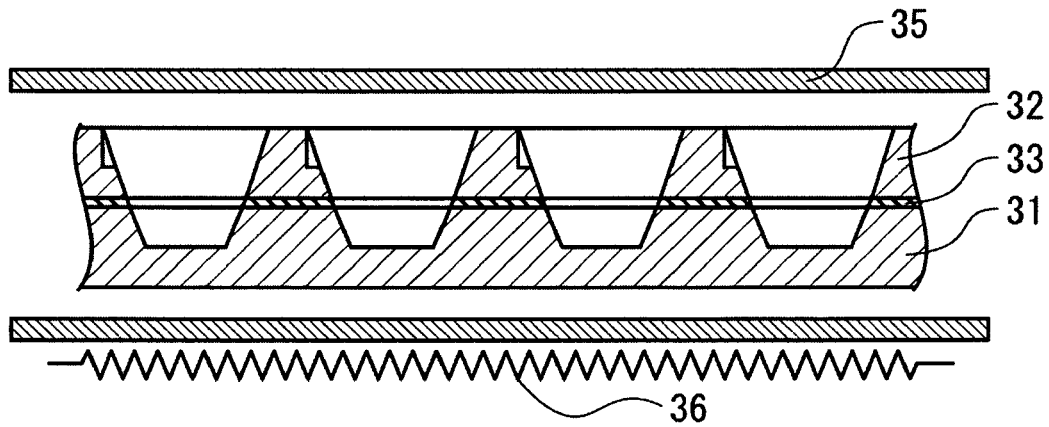

As shown in FIG. 2B, staked first substrate 31, insulating member 33 and second substrate 32 is put into a furnace 35 and heated to the melting temperature of hard solder, which is coated on upper and bottom surface of insulating member 33 (e.g. 700 degrees centigrade) by a heater 36 with no oxidation. Next the heated parts are cooled down gradually.

Figure 2C:
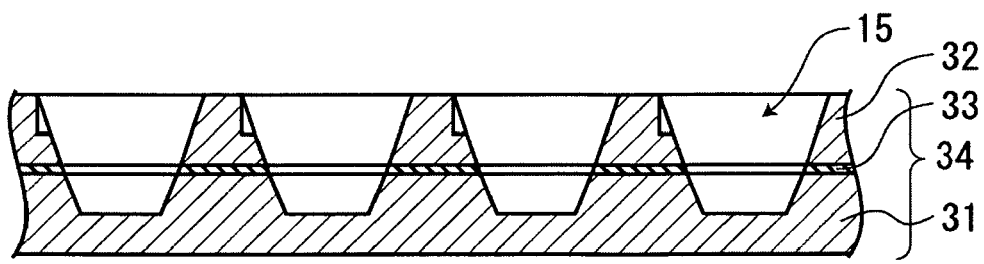

As shown in FIG. 2C, substrate 34, which first substrate 31, insulating member 33 and second substrate 32 are joined by hard solder. Hard solder is added to both sides of insulating member 33 prior to being joined with first substrate 31 and second substrate 32.

Figure 3A:
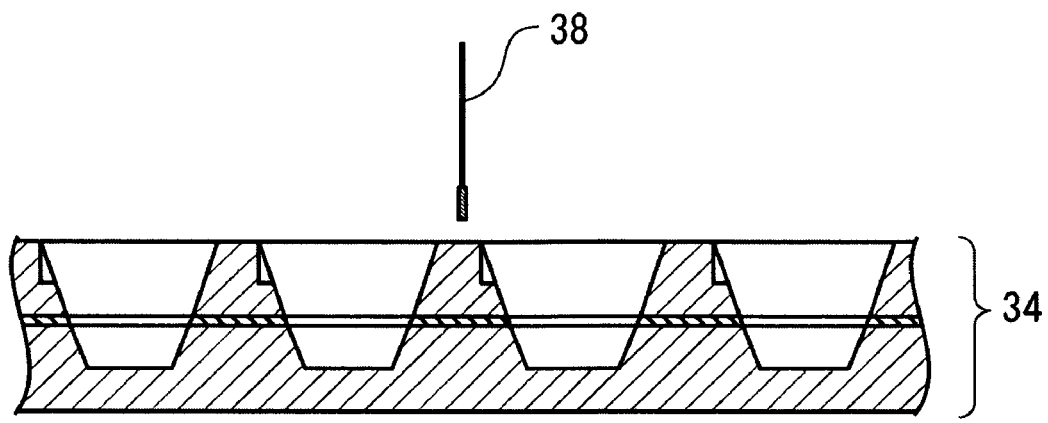
FIG. 3 is a cross sectional view of a package for a semiconductor light emitting element fabricated according to a first embodiment of a method in accordance with the present invention.
Figure 3B:
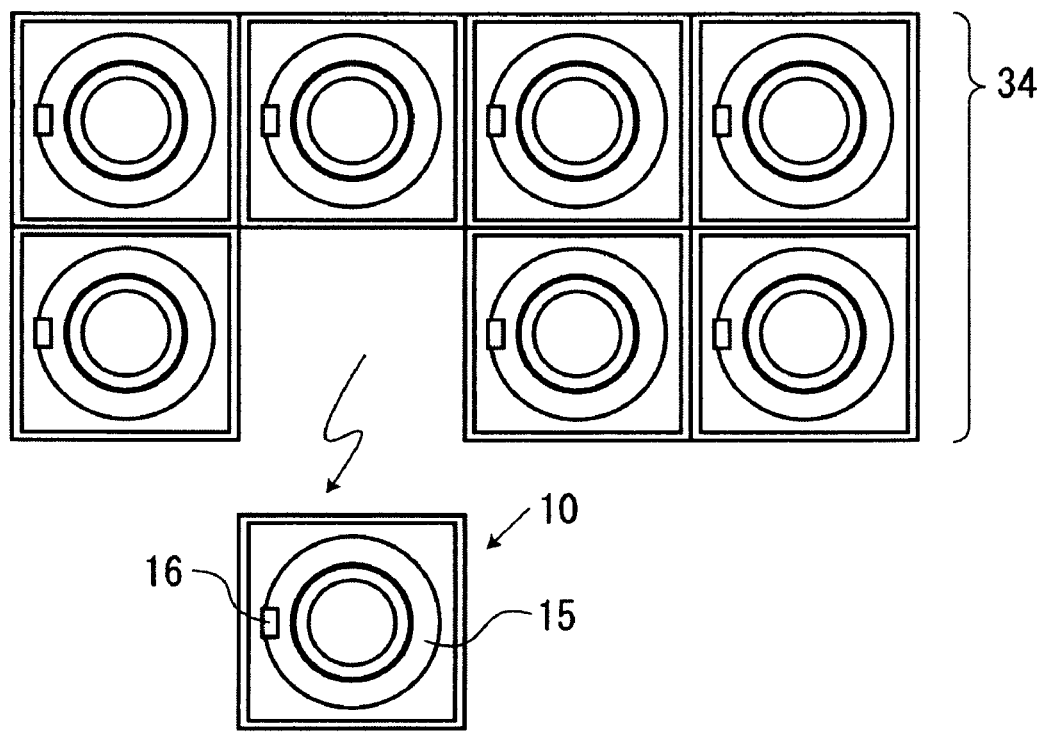

As shown in FIG. 3A and FIG. 3B, substrate 34 is adhered to a support board (not shown in FIG. 3A and FIG. 3B) such as a glass board. A protective layer (not shown in FIG. 3A and FIG. 3B) such as resist layer is formed on second metal substrate 32. Successively, substrate 34 is cut by blade 38 of dicing machine (not shown in FIG. 3A and FIG. 3B).

A surface being cut by blade 38 is etched by an acid enchant in order to make the surface smooth. Next, the resist layer and support board is removed from substrate 34.

Substrate 34 is plated by a plating metal, such as nickel (Ni) and silver (Ag), with non electrolytic plating. So the plating metal is formed on the surface of substrate 34 except on insulating member 33. The thinness of the plating metal may be about 1-5 micrometers.

A package for the semiconductor light emitting element, which has first metal substrate 11, insulating member 13, second metal substrate 12, and cup shaped portion 15 and cavity 16, is created.

Figure 4A:
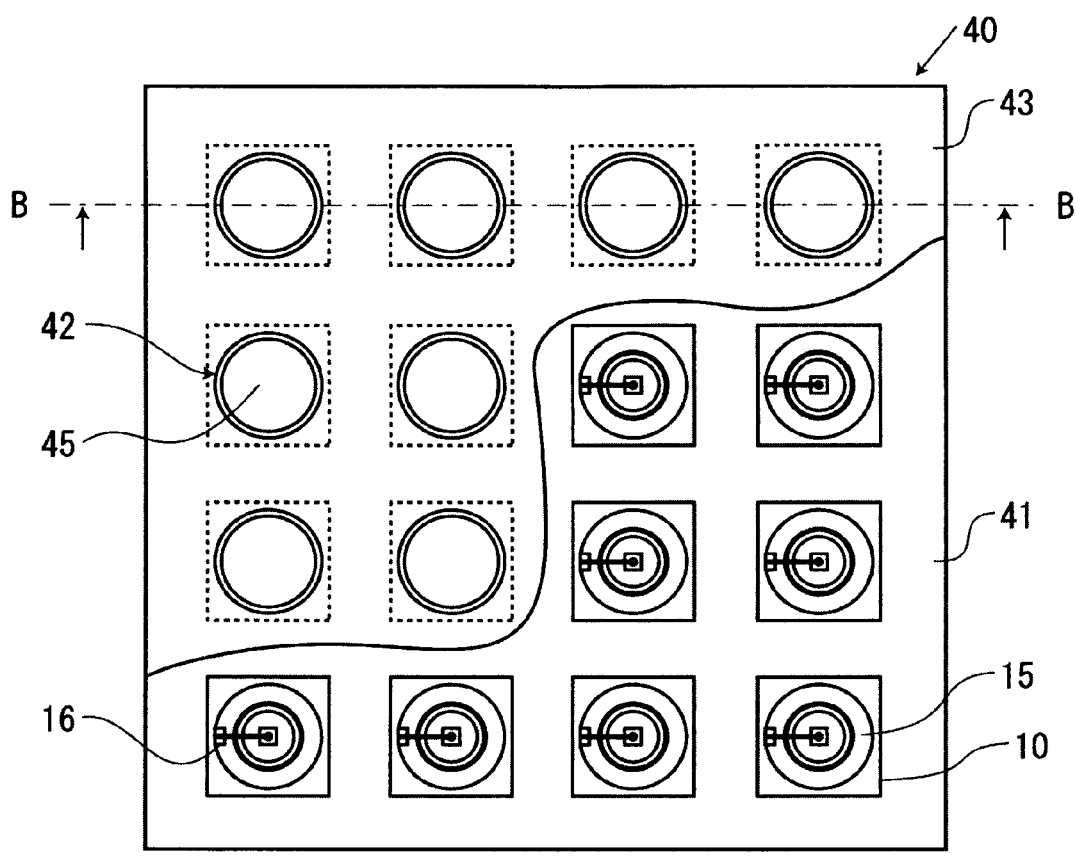
FIG. 4A is a plane view of a semiconductor light emitting device according to a first embodiment of the present invention and FIG. 4B is a cross sectional view taken along B-B line in FIG. 4A of a semiconductor light emitting device according to a first embodiment of the present invention.
Figure 4B:
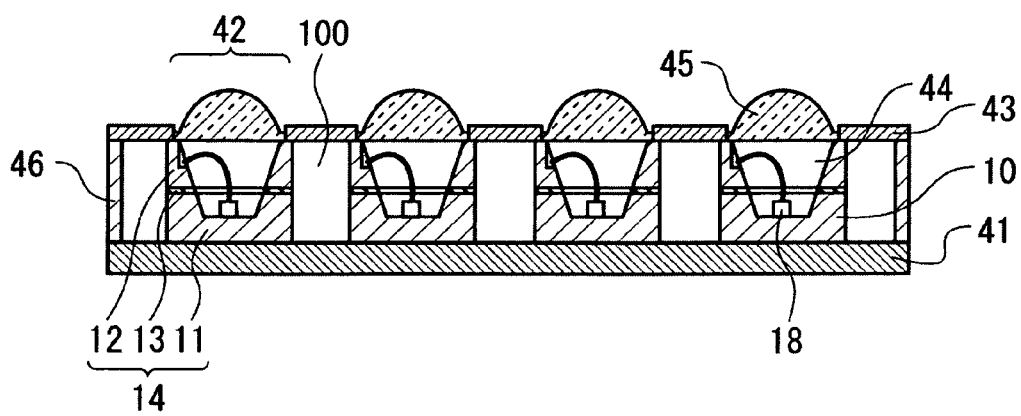

A semiconductor light emitting device will be explained hereinafter with reference to FIG. 4A and 4B. FIG. 4A is a plane view of a semiconductor light emitting device according to a first embodiment of the present invention. FIG. 4B is a cross sectional view taken along B-B line in FIG. 4A of a semiconductor light emitting device according to a first embodiment of the present invention.

As shown in FIGS. 4A and 4B, a semiconductor light emitting device 40 is formed a plurality of package for semiconductor light emitting device 10 is arrayed at predetermined intervals and fixed to one another. A second metal plate 43, which has a plurality of holes 42, is fixed on the package for semiconductor light emitting device 10. Hole 42 is substantially coincident with cup shaped portion 15.

Light emitting elements 18 are mounted on the bottom 17 of first metal substrates 11. First electrode of Light emitting element 18 is electrically connected to first metal substrate 11. Second electrode of light emitting element 18 and second metal substrate is electrically connected by a bonding wire.

The bonding wire is bonded on bottom 20 of cavity 16.

Each first electrode of semiconductor light emitting elements 18 is commonly connected to first metal board 41. The second electrode of semiconductor light emitting elements 18 is commonly connected to second metal board 43.

A resin 44, which is transparent to the wavelength of light from light emitting element 18, is enclosed in cup shaped portion 15. A lens 45 is provided on package for semiconductor light emitting element 10. The lens 45 is put (inserted) into hole 42 and fixed. The lens functions to focus the light to a general direction.

First metal board and second metal board functions not only as a common electric wire of cathode and anode but also as a heat radiation board. The efficiency of heat radiation of semiconductor light emitting device is improved.

In a conventional package for a semiconductor light emitting element, the position where the wiring from light emitting element is bonded is the top surface of substrate. So it is hard to provide connecting member on the top surface of substrate.

In aspects of the present invention, however, a surface of first metal board 41 and second metal board 43 may be covered by an insulating seal member 46. Cooling gas or water is supplied to a space 100 among neighboring substrates 44, first metal board 41 and second metal board 43. Thus the efficiency of heat radiation of semiconductor light emitting device is further improved.

Figure 5:
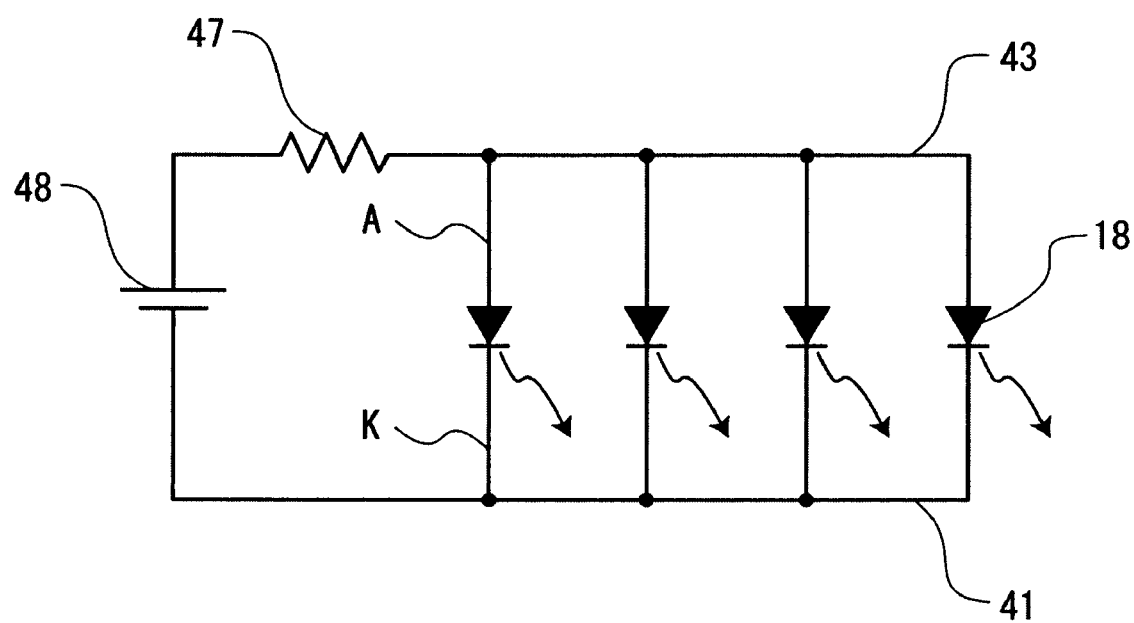
FIG. 5 is a circuit diagram of a semiconductor light emitting device according to a first embodiment of the present invention.

FIG. 5 is a circuit diagram of a semiconductor light emitting device according to a first embodiment of the present invention. Each cathode electrode K of semiconductor light emitting element 18 is connected to first metal board 41 as common cathode wire. Each anode electrode A of semiconductor light emitting element 18 is connected to second metal board 43 as a common anode wire. Semiconductor light emitting elements 18 are connected in parallel.

Semiconductor light emitting device 40 is connected to voltage supply 48 via resistance 47. It is available that a plurality of semiconductor light emitting devices 40 is connected serially or parallel to create a larger semiconductor light emitting device.

As described above, a package for semiconductor light emitting element according to this embodiment has cavity 16 in the cup shaped portion 15 of substrate 14. Thus wiring does not protrude outward from the uppermost part of cup shaped portion 15.

It is available that an electrical connecting member is provided on the top surface of substrate to connect neighboring semiconductor light emitting device. So it may be available to drive the semiconductor light emitting device by high current.

In this embodiment, the material of insulating member 13 is alumina and insulating member 13 has hard solder on its upper and bottom surfaces. But an insulating adhesive such as epoxy resin may be adapted to organic insulating member. Since the melting point of organic insulating adhesive is higher than that of hard solder, the fabrication time may be reduced.

THE SECOND EMBODIMENT

Figure 6A:
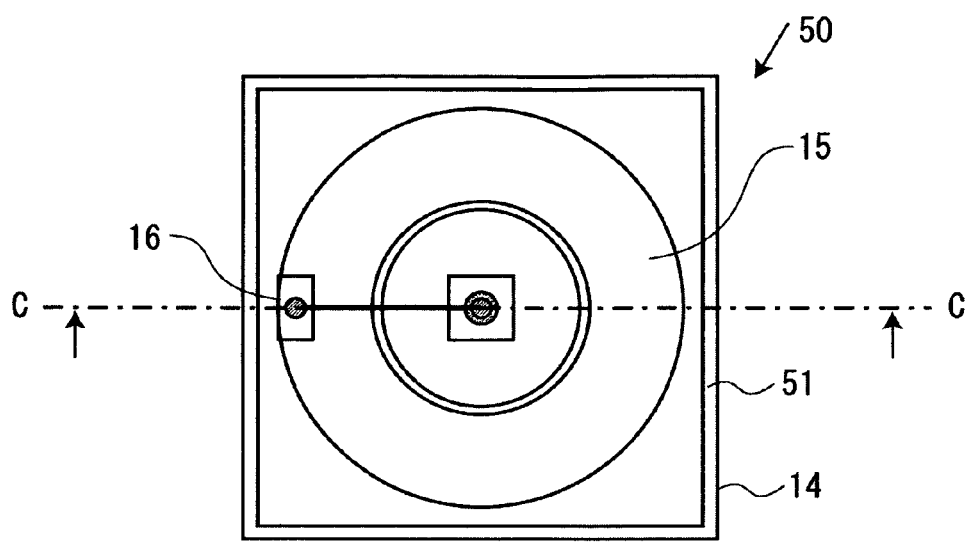
FIG. 6A is a plane view of a package for semiconductor light emitting element according to a second embodiment of the present invention.

A second embodiment of the present invention will be explained with reference to FIG. 6A to FIG. 7. FIG. 6A is a plane view of a package for semiconductor light emitting device according to a second embodiment of the present invention, and FIG. 6B is a cross sectional view of a package for semiconductor light emitting element according to a second embodiment of the present invention.

With respect to each portion of this second embodiment, the same portion of the package for semiconductor light emitting device of the first embodiment shown in FIG. 1A to FIG. 5 is designated by the same reference numeral, and its explanation is omitted.

The structure of this embodiment will be explained with reference to FIG. 6A and FIG. 7 hereinafter. The package for semiconductor light emitting device according to this embodiment has protrusion on the top surface of its substrate.

Figure 6B:
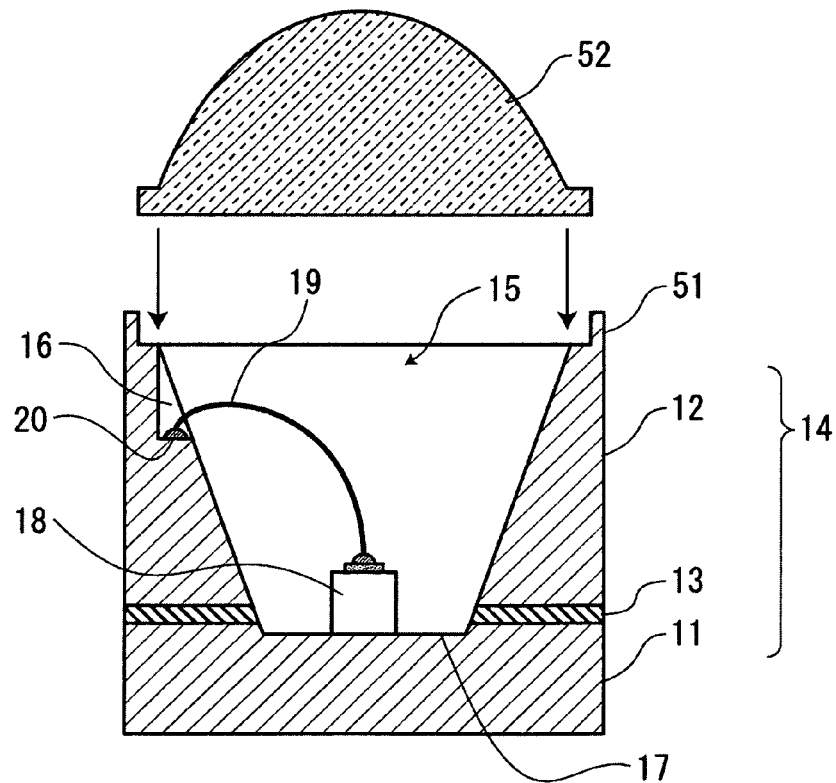
FIG. 6B is a cross sectional view of a package for semiconductor light emitting element according to a second embodiment of the present invention.

As shown in FIG. 6B, package for semiconductor light emitting device 50 has a protrusion 51 on the top surface of substrate 12. Protrusion 51 is formed so as to surround cup shaped portion 15. Protrusion 51 functions as a guide for inserting a lens into package for semiconductor light emitting device 50. In this embodiment, protrusion 51 is provided outermost potion of top surface 12b of substrate 14.

Alternatively, protrusion 51 may be formed on the top of the substrate separately in every 120 degree from center of the cup shaped portion 15 (namely, at three points evenly spaced from the center of cup shaped portion 15 on the top surface of the substrate).

The height from bottom 17 to insulating member 13 is smaller than that one described in the first embodiment. So the area for outside surface of second metal substrate is greater.

This may improve the heat radiation of package of the semiconductor light emitting device.

Figure 7:
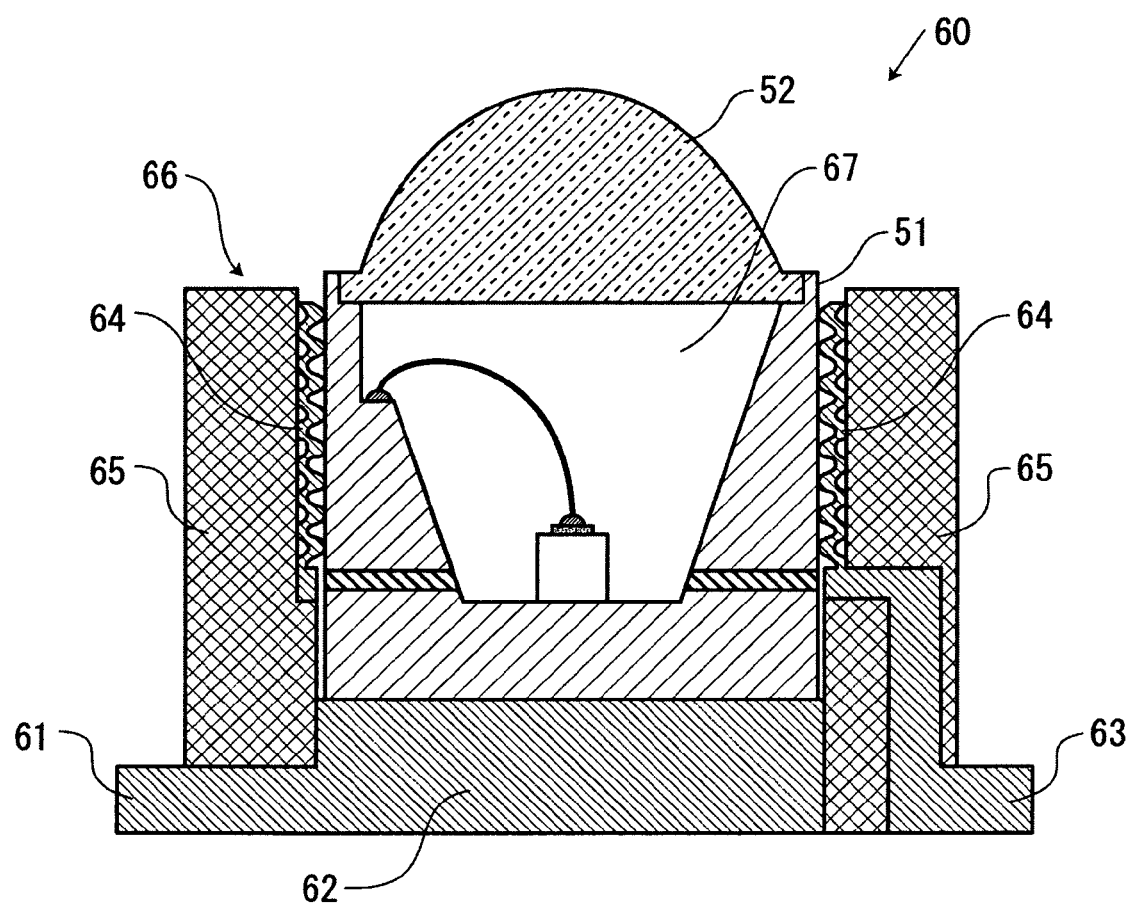
FIG. 7 is a cross sectional view of a light emitting device according to a second embodiment of the present invention.

FIG. 7 is a cross sectional view of a light emitting device according to a second embodiment of the present invention.

As shown in FIG. 7, a semiconductor light emitting device 60 has package for semiconductor light emitting device 50 and a socket 66. Package 50 is inserted into socket 66 and fixed.

Socket 66, which is molded by resin 65, has a first lead frame 61, a second lead frame 63, an island region of lead frame 62 and a leaf spring electrode 64.

First lead frame 61 and island region of lead frame 62 are electrically connected. Second lead frame 63 and leaf spring electrode 64 are electrically connected.

The back surface of package 50 contacts with island region 62. The outside surface contacts with leaf spring electrode 64.

First electrode of semiconductor light emitting element 18 is connected to island portion 62 via first metal substrate 11. Island portion 62 is connected to a first lead frame 61.

Second electrode of semiconductor light emitting element 18 is connected to leaf spring electrode 64 via wiring and second metal substrate 12. Leaf spring electrode 64 is connected to a second lead frame 63.

A resin 67 which is transparent against light from light emitting device is molded in cup shaped portion 15. Lens 52 is inserted into protrusion 51 and fixed.

Package 60 is available to put into and off socket 66 freely.

Figure 8A:
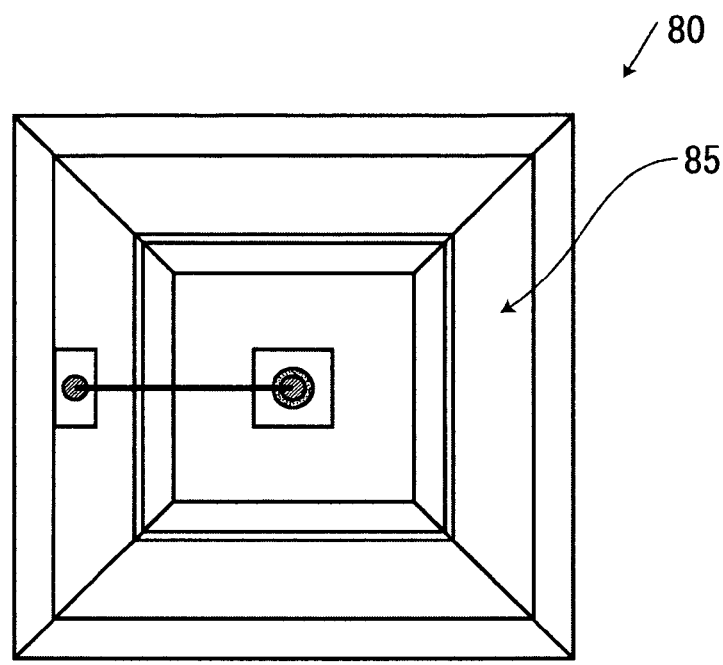
FIG. 8 is a plane view of a package for semiconductor device according to another embodiment of the present invention.
Figure 8B:
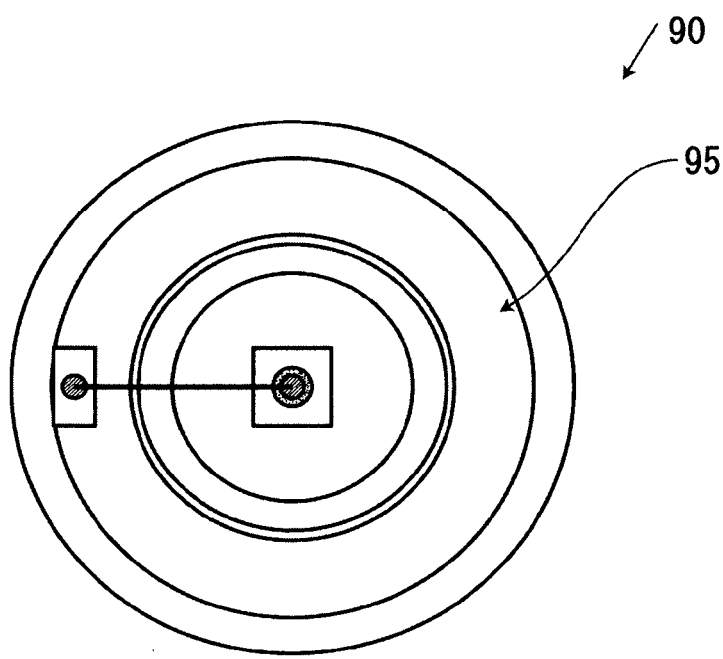

As above mentioned, a shape of package in the plane view is square and cup shaped portion in the plane view is circle. But the shape of package and cup shaped portion in the plane view may be square shown in FIG. 8A. The shape of package and cup shaped portion in the plane view may be circle shown in FIG. 8B.

It is easy to insert package into socket 66 because it is easy to align them.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A package for semiconductor light emitting element, comprising:
   a first metal substrate having a cup shaped recess portion;
   an insulating member having a first cup shaped opening, said insulating member provided on the first metal substrate; and
   a second metal substrate having a second cup shaped opening, provided on the insulating member and being electrically insulated from the first metal substrate, said second metal substrate having a cavity in an inner surface of said second metal substrate.

2. The package for semiconductor light emitting element of claim 1, wherein a bottom of the cavity is substantially flat.

3. The package for semiconductor light emitting element of claim 1, wherein a top surface of the second metal substrate has a flat portion.

4. The package for semiconductor light emitting element of claim 1, further comprising a protrusion on a top surface of the second metal substrate.

5. The package for semiconductor light emitting element of claim 1, wherein an inner surface of the first metal substrate, an inner surface of the insulating member and an inner surface of the second metal substrate are substantially flat except the cavity.

6. The package for semiconductor light emitting element of claim 1, wherein an outside shape, in the plane view, of the first metal substrate, the second metal substrate and the insulating member are substantially square.

7. The package for semiconductor light emitting element of claim 1, wherein a shape, in the plane view, of the first recess portion, the first opening and the second opening is substantially circle.

8. A semiconductor light emitting device, comprising:
   a first metal substrate having a cup shaped recess portion;
   an insulating member having a first cup shaped opening, provided on the first metal substrate;
   a second metal substrate having a second cup shaped recess portion, said second metal substrate provided on the insulating member and being electrically insulated from the first metal substrate, said second metal substrate having a cavity in an inner surface of said second metal substrate;
   a light emitting element mounted on the first metal substrate, a first electrode of the light emitting element being electrically connected to the first metal substrate;
   a wiring connecting the light emitting element and the second substrate, one end of the wiring being connecting to a second electrode of the light emitting element, another end of the wiring being connecting to the second metal substrate.

9. The semiconductor light emitting device of claim 8, wherein the highest part of the wiring is under a top surface of the second substrate.

10. The semiconductor light emitting device of claim 8, wherein a bottom of the cavity is substantially flat.

11. The semiconductor light emitting device of claim 8, wherein a top surface of the second metal substrate has a flat portion.

12. The semiconductor light emitting device of claim 8, further comprising a protrusion on a top surface of the second metal substrate.

13. The semiconductor light emitting device of claim 12, further comprising a lens provided on the second metal substrate, the lens being inserted fit in the protrusion.

14. The semiconductor light emitting device of claim 13, wherein the highest part of the wiring is under the lens.

15. The semiconductor light emitting device of claim 8, further comprising a first lead frame being electrically connected to the first metal substrate, a second lead frame being electrically connected to the second metal substrate.

16. The semiconductor light emitting device of claim 8, wherein the insulating member is provided over the top of the light emitting element.

17. The semiconductor light emitting device of claim 8, wherein the insulating member is provided under the top of the light emitting element.

18. The semiconductor light emitting device of claim 8, wherein an inner surface of the first metal substrate, an inner surface of the insulating member and an inner surface of the second metal substrate are substantially flat except the cavity.

19. The semiconductor light emitting device of claim 8, wherein an outside shape, in the plane view, of the first metal substrate, the second metal substrate and the insulating member is substantially square.

20. The semiconductor light emitting device of claim 8, wherein a shape, in the plane view, of the first recess portion, the first opening and the second opening is substantially circle.

* * * * *